(12) United States Patent
Geiss et al.

(10) Patent No.: US 7,491,985 B2
(45) Date of Patent: Feb. 17, 2009

(54) METHOD OF COLLECTOR FORMATION IN BICMOS TECHNOLOGY

(75) Inventors: Peter J. Geiss, Underhill, VT (US);
Peter B. Gray, Essex Junction, VT (US);
Alvin J. Joseph, Williston, VT (US);
Qizhi Liu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/288,843

(22) Filed: Nov. 29, 2005

(65) Prior Publication Data

US 2006/0124964 A1    Jun. 15, 2006

Related U.S. Application Data

(63) Continuation of application No. 10/711,479, filed on Sep. 21, 2004, now Pat. No. 7,002,190.

(51) Int. Cl.
*H01L 31/072*  (2006.01)
*H01L 31/109*  (2006.01)
*H01L 31/0328*  (2006.01)
*H01L 31/0336*  (2006.01)

(52) U.S. Cl. ..................... 257/197; 257/198
(58) Field of Classification Search .............. 257/197, 257/198
See application file for complete search history.

(56) References Cited

U.S. PATENT DOCUMENTS

| | | | | |
|---|---|---|---|---|
| 4,549,927 A | | 10/1985 | Goth et al. | |
| 4,589,193 A | * | 5/1986 | Goth et al. | 438/430 |
| 4,949,151 A | | 8/1990 | Horiuchi et al. | |
| 5,061,646 A | | 10/1991 | Sivan et al. | |
| 5,319,239 A | * | 6/1994 | Ning | 257/585 |
| 6,271,068 B1 | | 8/2001 | Hsu et al. | |
| 6,333,235 B1 | | 12/2001 | Lee et al. | |
| 6,627,972 B1 | | 9/2003 | Ehwald et al. | |
| 6,630,377 B1 | | 10/2003 | Panday et al. | |
| 2003/0173580 A1 | * | 9/2003 | Coolbaugh et al. | 257/183 |
| 2003/0193077 A1 | | 10/2003 | Fujii | |
| 2005/0250289 A1 | * | 11/2005 | Babcock et al. | 438/309 |

* cited by examiner

*Primary Examiner*—Long Pham
(74) *Attorney, Agent, or Firm*—Scully, Scott, Murphy & Presser, P.C.; Richard M. Kotulak, Esq.

(57) ABSTRACT

A heterobipolar transistor (HBT) for high-speed BiCMOS applications is provided in which the collector resistance, Rc, is lowered by providing a buried refractory metal silicide layer underneath the shallow trench isolation region on the subcollector of the device. Specifically, the HBT of the present invention includes a substrate including at least a subcollector; a buried refractory metal silicide layer located on the subcollector; and a shallow trench isolation region located on a surface of the buried refractory metal silicide layer. The present invention also provides a method of fabricating such a HBT. The method includes forming a buried refractory metal silicide underneath the shallow trench isolation region on the subcollector of the device.

20 Claims, 11 Drawing Sheets

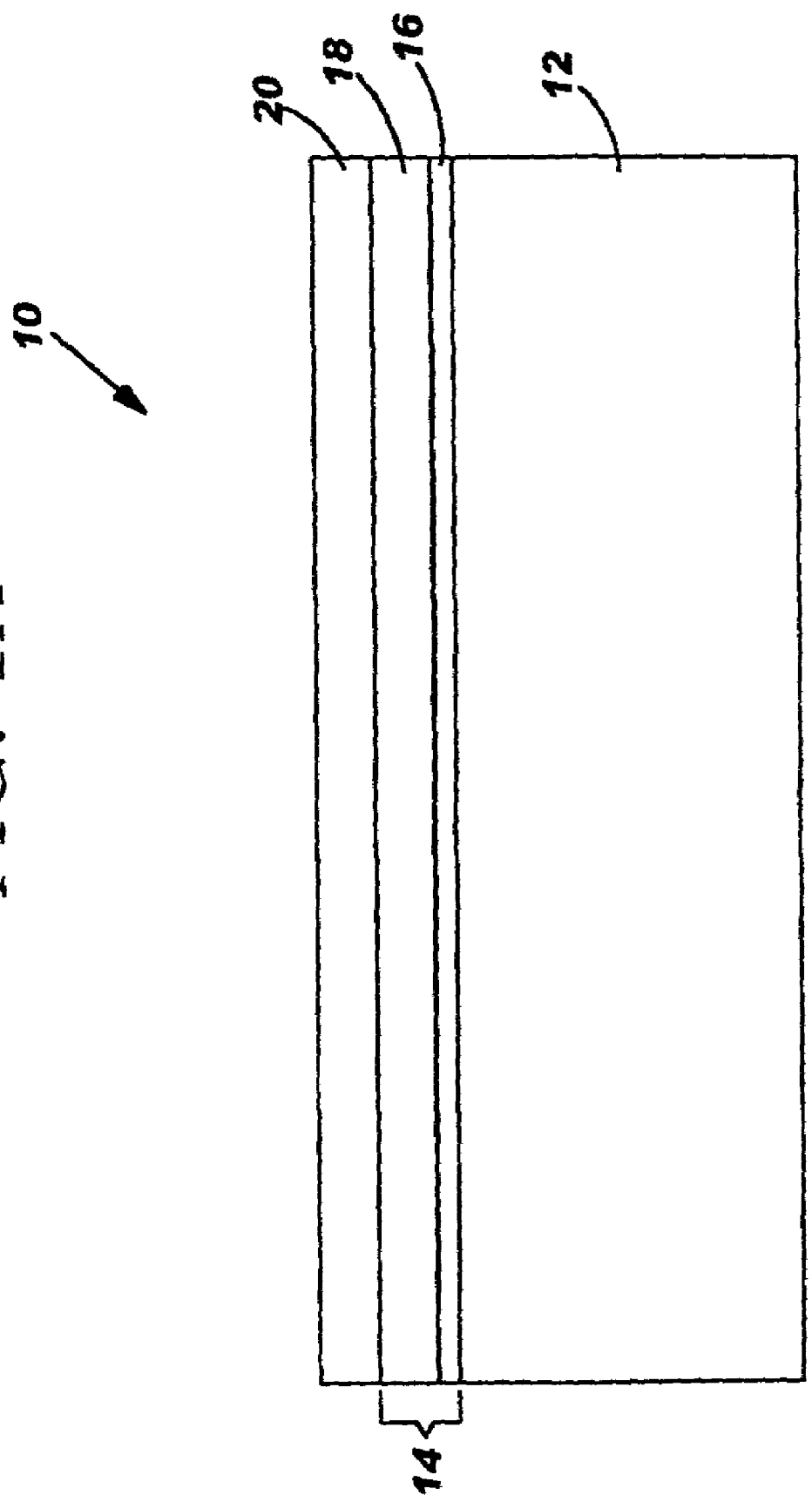

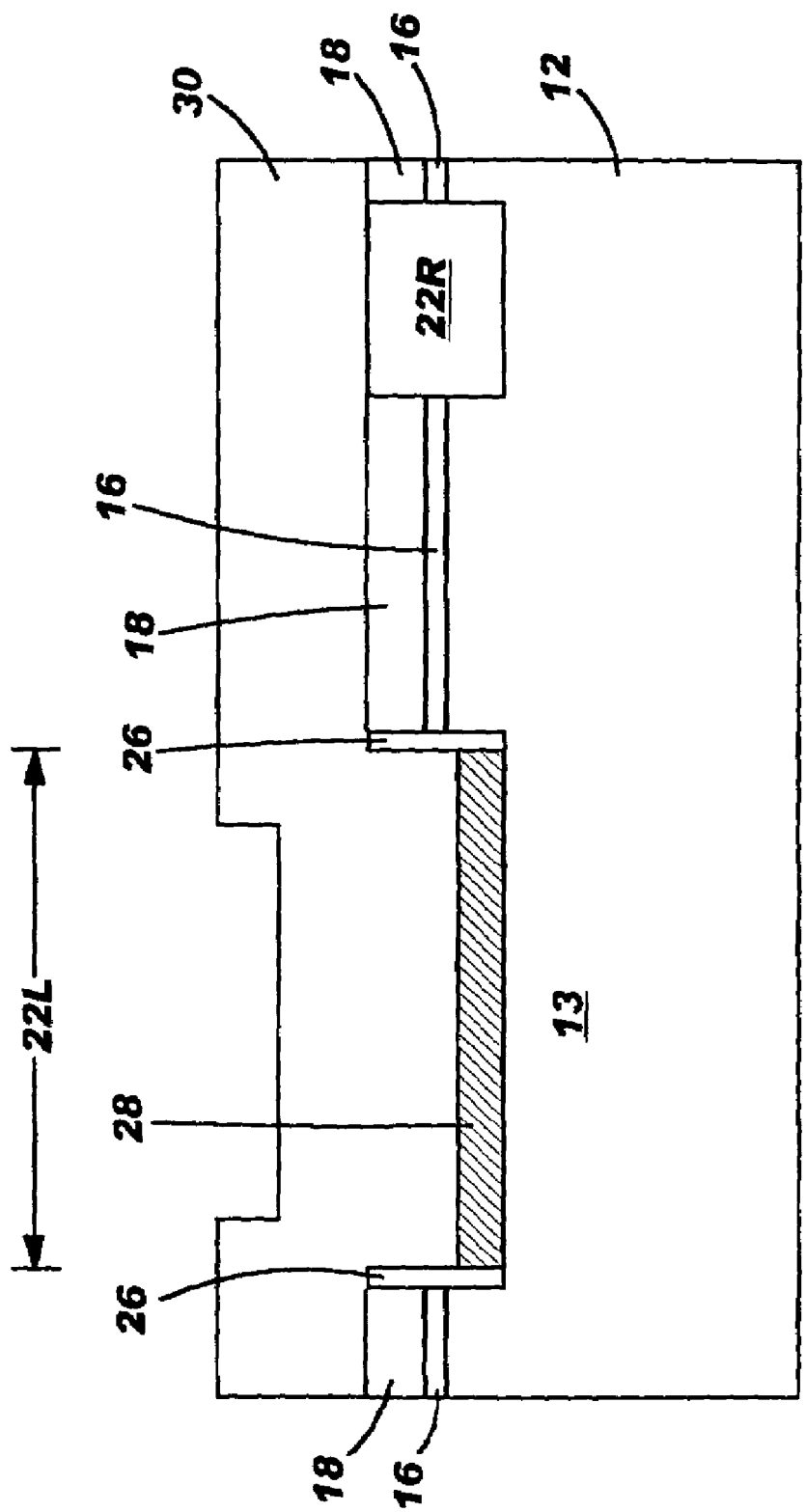

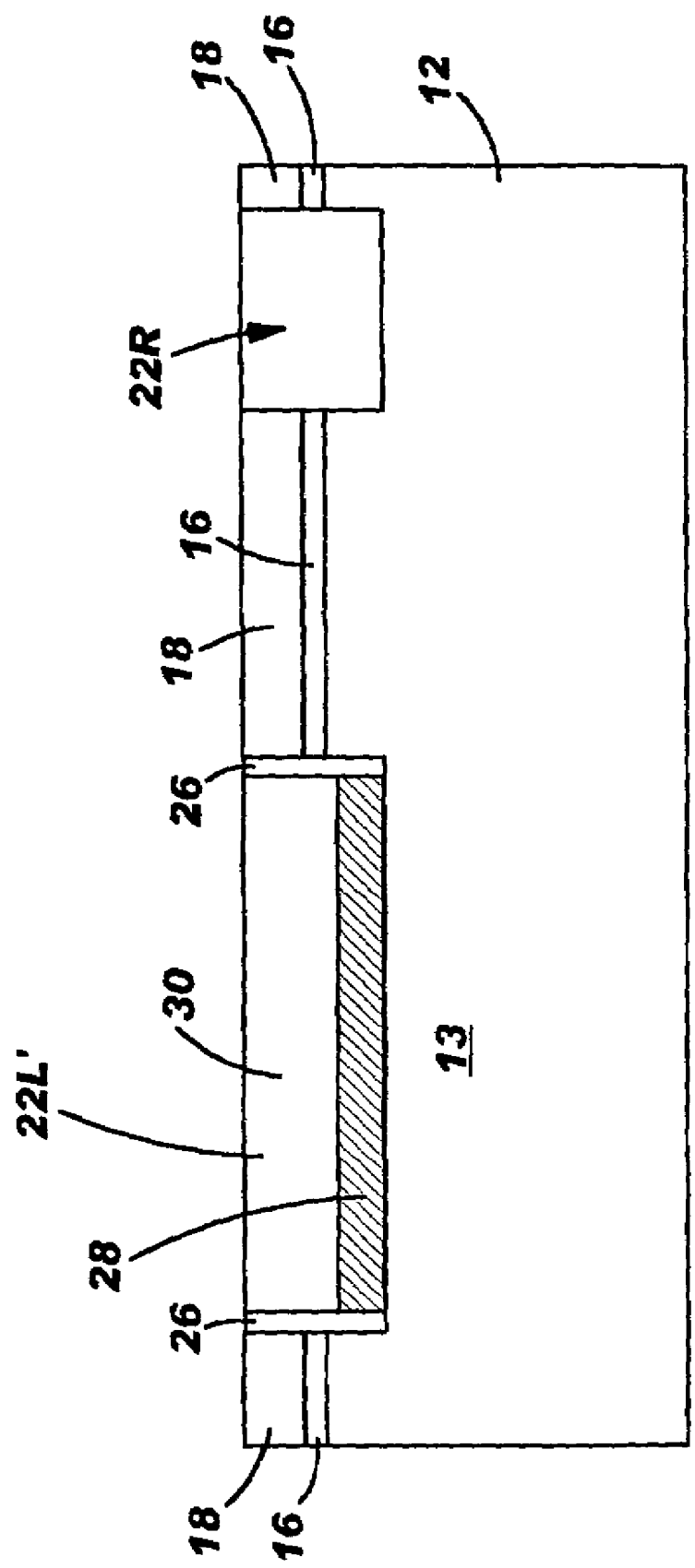

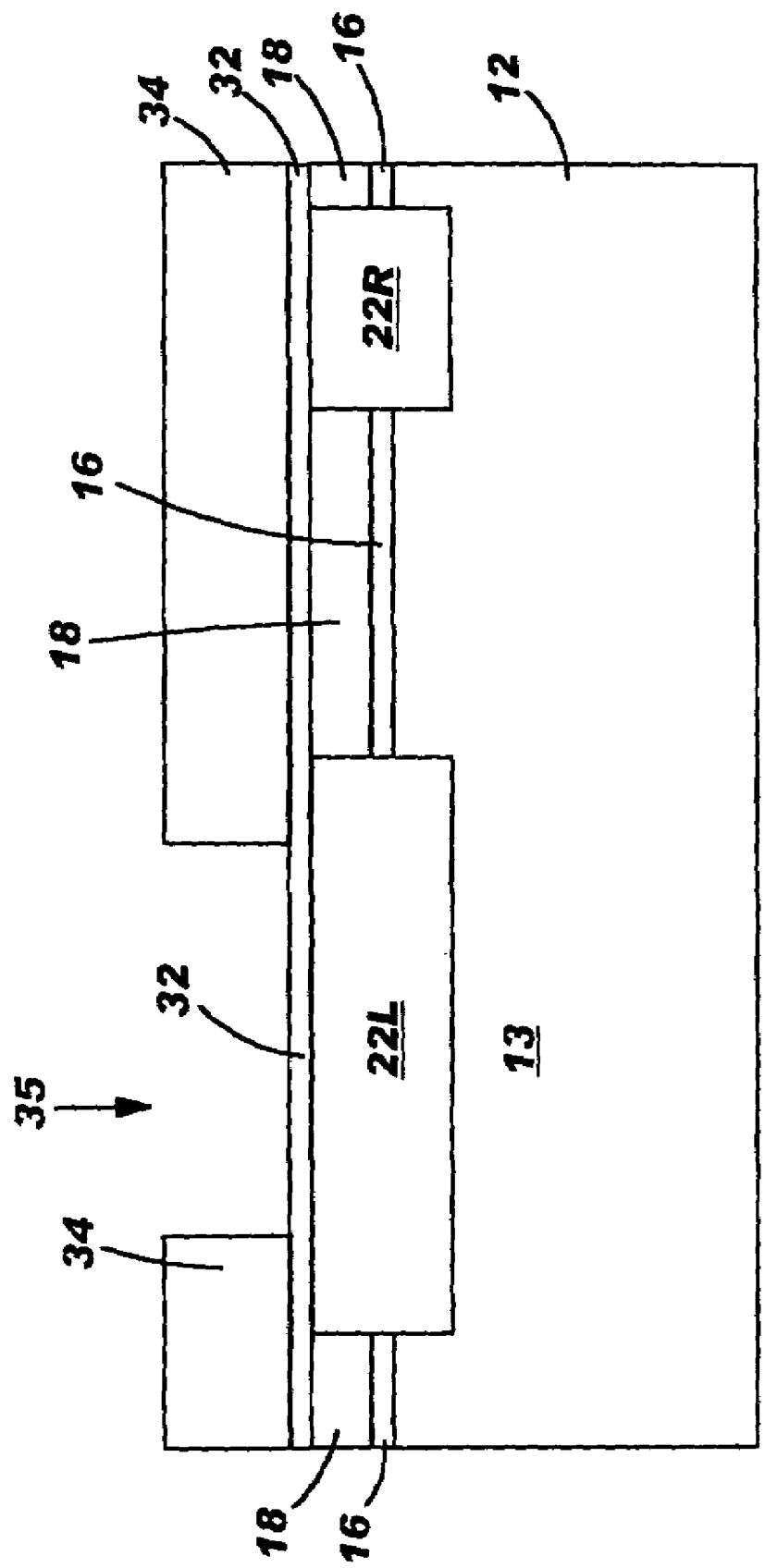

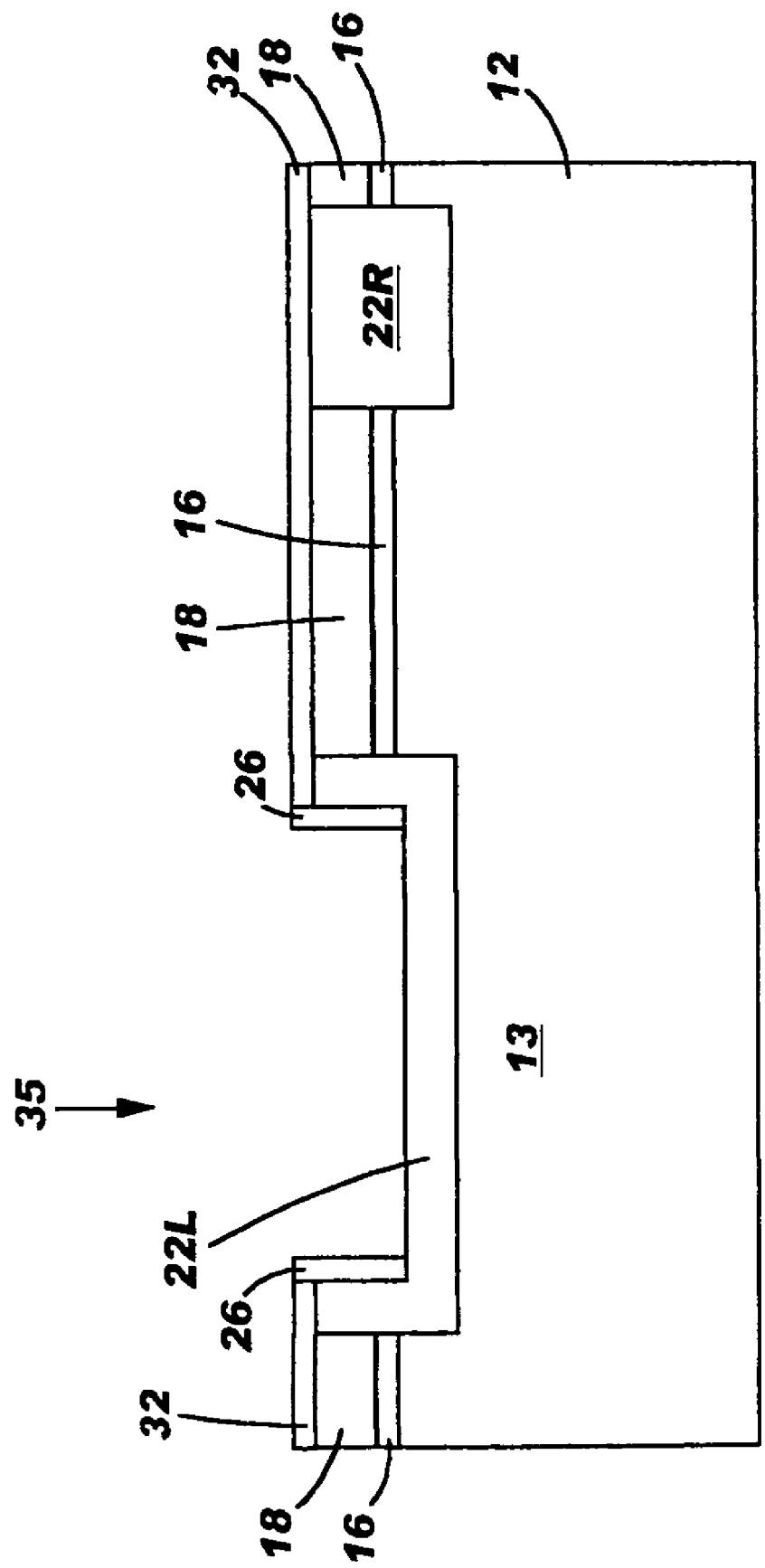

METHOD OF COLLECTOR FORMATION IN BICMOS TECHNOLOGY

RELATED APPLICATIONS

This application is a continuation of U.S. application Ser. No. 10/711,479, filed Sep. 21, 2004 now U.S. Pat. No. 7,002, 190.

FIELD OF THE INVENTION

The present invention relates generally to bipolar and complementary metal oxide semiconductor (BiCMOS) technology and, more particularly to a bipolar transistor (NPN or PNP) that includes a buried refractory metal silicide layer underneath a shallow trench isolation region on the subcollector of the device. The bipolar transistor of the present invention exhibits reduced collector resistance, Rc, therefore it is applicable for use in high-speed applications. The present invention is also related to a method of fabricating the inventive bipolar transistor that includes the buried refractory metal silicide layer underneath the shallow trench isolation region on the subcollector of the device.

BACKGROUND OF THE INVENTION

Bipolar transistors are electronic devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "NPN" transistor. Alternatively, if the opposite doping configuration is used, the device is a "PNP" transistor. Because the mobility of minority carriers, i.e., electrons, in the base region of NPN transistors is higher than that of holes in the base of PNP transistors, higher-frequency operation and higher-speed performances can be obtained with NPN transistor devices. Therefore, NPN transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called 'heterojunction' transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

The advanced silicon-germanium bipolar and complementary metal oxide semiconductor (BiCMOS) technology uses a SiGe base in the heterojunction bipolar transistor. In the high-frequency (such as multi-GHz) regime, conventional compound semiconductors such as GaAs and InP currently dominate the market for high-speed wired and wireless communications. SiGe BiCMOS promises not only a comparable performance to GaAs in devices such as power amplifiers, but also a substantial cost reduction due to the integration of heterojunction bipolar transistors with standard CMOS, yielding the so-called "system on a chip."

For high-performance NPN HBT fabrication, a low collector resistance, Rc, is needed. Currently, Rc comes mainly from the subcollector that is a heavily n-doped Si, and is 8 ohms/square. The n+ subcollector is almost the highest manufacturable-doped Si for low resistance. Double collector layout designs are known which can be used to lower Rc. Despite lower Rc, double collector layout designs increase the collector-to-base capacitance, Ccb, and lower the NPN areas. Thus, the double collector layout design has its limitation in improving NPN performance.

In view of the drawbacks mentioned with prior art HBTs, there is still a need for providing a HBT that has low collector resistance without trading off Ccb and NPN area as is the case with prior art double collector layout designs. Additionally, there is a need for providing such a HBT in which the normal BiCMOS process flow is minimally disturbed.

SUMMARY OF THE INVENTION

The present invention provides a heterobipolar transistor (HBT) having a lower Rc than conventional HBTs by providing a buried refractory metal silicide underneath the shallow trench isolation region on the subcollector of the device. Refractory metal silicides such as, for example, tungsten silicide, can survive the subsequent high-temperature thermal cycles in CMOS and bipolar modules, while offering a lower resistance subcollector, and minimally disturbing the BiCMOS process flow.

In broad terms, the present invention provides a heterobipolar transistor (HBT) that comprises:

a substrate including at least a subcollector;

a buried refractory metal silicide layer located on the subcollector; and a shallow trench isolation region located on a surface of said buried refractory metal silicide layer.

The HBT of the present invention can be either a NPN or a PNP HBT, with NPN HBTs being highly preferred. The HBT structure of the present invention further includes a SiGe base located on a surface of said substrate, which is adjacent to the shallow trench isolation region, and an emitter comprising polySi located on the base.

In addition to the structure described above, the present invention also provides a method of fabricating such a HBT. Specifically, the inventive HBT is fabricated using processing steps that comprise:

forming at least one shallow trench isolation region containing a first trench dielectric material in a substrate including a subcollector;

removing said first trench dielectric material from said at least one shallow trench isolation region to form an opening that exposes a portion of said substrate including said subcollector;

forming a refractory metal silicide layer in a portion of said opening on said exposed portion of the substrate, said refractory metal silicide layer not extending above said opening; and forming a second trench dielectric on said refractory metal silicide layer in said opening, said second trench dielectric not extending above said opening.

BRIEF DESCRIPTION OF THE DRAWINGS

FIGS. 1A-1F are pictorial representations (through cross sectional views) illustrating the basic processing steps that are employed in the present invention for silicidation of the collector. The structure shown in FIG. 1F is a template in which to form the HBT thereon.

FIGS. 2A-2E are pictorial representations (through cross sectional views) illustrating an alternative embodiment of the present invention.

DETAILED DESCRIPTION OF THE INVENTION

Figure 1B:
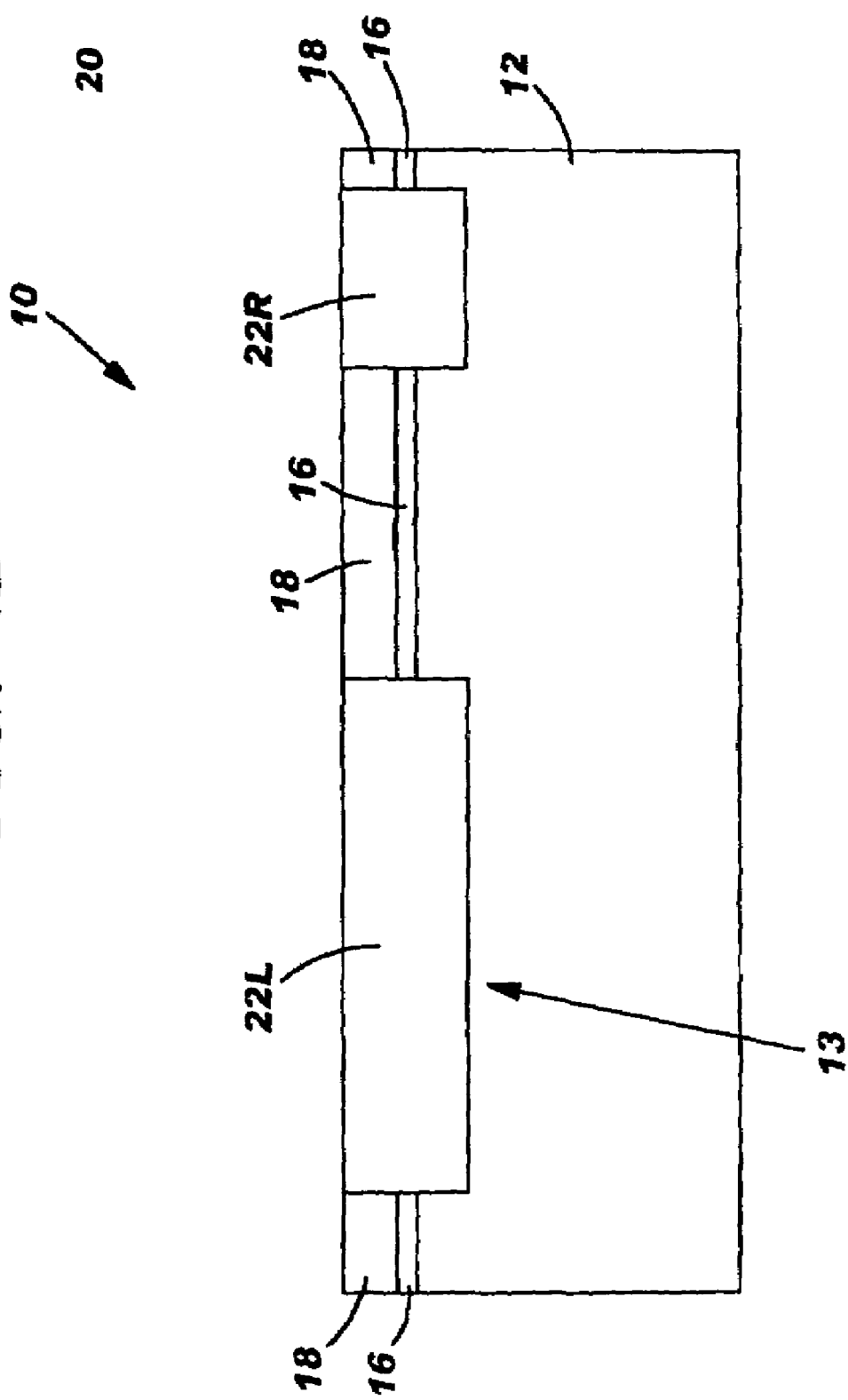

The present invention, which provides a HBT that has a buried refractory metal silicide layer underneath a shallow trench isolation region on the subcollector of the device and a method of fabricating the same, will now be described in greater detail by referring to the drawings that accompany the present application. It is noted that the drawings are not drawn to scale and thus are provided for illustrative purposes only. Moreover, the drawings provided in the present application illustrate the substrate including the buried refractory metal silicide layer underneath the shallow trench isolation region on the subcollector prior to forming the base and emitter of the HBT device.

It is also worth noting that the drawings of the present application illustrate only the HBT device area. For clarity, the CMOS device areas as well as other areas of a typical BiCMOS structure are not shown. These other areas not shown lay to the periphery of the HBT area shown. Additionally, although a single HBT device area is shown, the present invention can be used in forming a plurality of HBTs on top of a single substrate.

Reference is first made to FIGS. 1A-1F which illustrate a first embodiment of the present invention. The first embodiment of the present invention begins with providing an initial structure 10 such as shown, for example, in FIG. 1A. The structure 10 of the present invention includes a substrate 12 having a pad stack 14 and a hard mask 20 located thereon. As shown, pad stack 14 is located on a surface of substrate 12 and the hard mask 20 is located on an upper exposed surface of the pad stack 14.

The substrate 12 employed in the present invention includes any semiconductor substrate including for example, Si, SiGe, SiC, SiGeC, GaAs, InAs, InP and other III/V or II/VI compound semiconductors. The substrate 12 may also comprise a preformed silicon-on-insulator (SOI) or silicon germanium-on-insulator (SGOI) substrate. In a preferred embodiment of the present invention, substrate 12 is a Si-containing substrate such as Si, SiGe, SiGeC, SiC, SOI and SGOI. Alternatively, the substrate 12 may include a stack structure wherein a Si layer such as epi-Si or amorphous Si is formed atop a semiconductor substrate. The substrate 12 may include various doping or well regions. The substrate 12 also includes a subcollector 13, which is part of the substrate shown in the drawings of the present invention. FIG. 1B clearly defines the subcollector 13. As known to those skilled in the art, the subcollector 13 connects the HBT device to an adjacent collector region. The subcollector 13 is formed using techniques well known to those skilled in the art. For example, ion implantation and a subsequent anneal can be used in fabricating the subcollector 13.

The pad stack 14 may include a single layer of insulating material, or it may include a multilayered stack of insulating materials, as is shown in FIG. 1A. Illustrative examples of insulating materials that can be employed as the pad stack 14 include oxides, nitrides, oxynitrides, and multilayers thereof.

The pad stack 14 can be formed by the same or different deposition technique including for example, thermal growth (i.e., oxidation, nitridation or oxynitridation), chemical vapor deposition (CVD), plasma-enhanced chemical vapor deposition (PECVD), chemical solution deposition, atomic layer deposition (ALD), evaporation and other like deposition means.

Specifically, the pad stack 14 shown in FIG. 1A includes a pad oxide 16 located on the surface of the substrate 12 and a pad nitride 18 located on the pad oxide 16. The pad oxide 16 is typically formed by thermal oxidation, while the pad nitride 18 is typically formed by chemical vapor deposition.

The thickness of the pad stack 14 may vary depending on the number of material layers present in the stack. In the case illustrated in the drawings, the pad oxide 16 is thinner than the overlaying pad nitride 18. Typically, the pad oxide 16 has a thickness from about 3 to about 50 nm, with a thickness from about 5 to about 20 nm being more typical. The pad nitride 18, on the other hand, typically has a thickness from about 50 to about 300 nm, with a thickness from about 100 to about 200 nm being more typical.

A hard mask 20 is formed on the upper most exposed surface of the pad stack 14; in the embodiment illustrated, the hard mask 20 is formed atop the surface of the pad nitride 18. The hard mask 20 is comprised of an insulating material such as an oxide deposited from tetraethylorthosilicate (TEOS) using deposition techniques well known to those skilled in the art. The hard mask 20 is used as a patterned mask in forming the subsequent shallow trench isolation regions. The thickness of hard mask 20 may vary depending on the insulating material and deposition process used. Typically, the hard mask 20 has a thickness from about 50 to about 300 nm, with a thickness from about 100 to about 200 nm being more typical.

Next, and as shown in FIG. 1B, at least one shallow trench isolation region is formed. In the drawing, two shallow trench isolation regions 22L and 22R are formed. The term "shallow trench isolation" denotes an isolation region having a measured depth, from the top surface of the substrate 12 to the bottom surface of the trench opening, from about 0.5 micron or less. Hard mask 20 is typically removed from the structure after the trench isolation regions have been etched.

The at least one shallow trench isolation region, 22L and 22R, is formed using conventional processing well known to those skilled in the art, including, for example, lithography (e.g., applying a photoresist material, exposing the photoresist to a pattern of radiation and developing the exposed photoresist using a conventional resist developer), etching (e.g., wet etching, dry etching or a combination thereof), and trench fill. Optionally, the trench may be lined with a trench liner material such as an oxide, nitride or oxynitride prior to trench fill. The trench fill includes a first trench dielectric material such as a high-density oxide or TEOS deposited by conventional techniques. A densification step (e.g., annealing) and/or planarization (e.g., chemical mechanical polishing) may optionally be used following the trench fill process.

Prior to filling the trench with the first trench dielectric material, C is typically implanted into the subcollector 13 and collector (not shown) of the substrate 12 using C implantation processes that are well known to those skilled in the art.

Next, a block mask (not shown) is formed atop the structure provided in FIG. 1B so that at least one shallow trench isolation region 22L, which is located over the subcollector 13, is exposed and the first trench dielectric in region 22L is removed such that opening 24 is formed. The opening 24 exposes a surface of substrate 12 including the subcollector 13. The block mask is formed using conventional techniques well known to those skilled in the art including, for example, lithography.

The removal step, which removes the first trench dielectric material from shallow trench isolation region 22, comprises an etching process that selectively removes the first trench dielectric material. An example of an etching process that selectively removes the first trench dielectric material from the shallow trench isolation region 22L is HF dip. Note that the presence of the block mask prevents removal of the first trench dielectric material from the other shallow trench isolation region 22R.

Figure 1C:
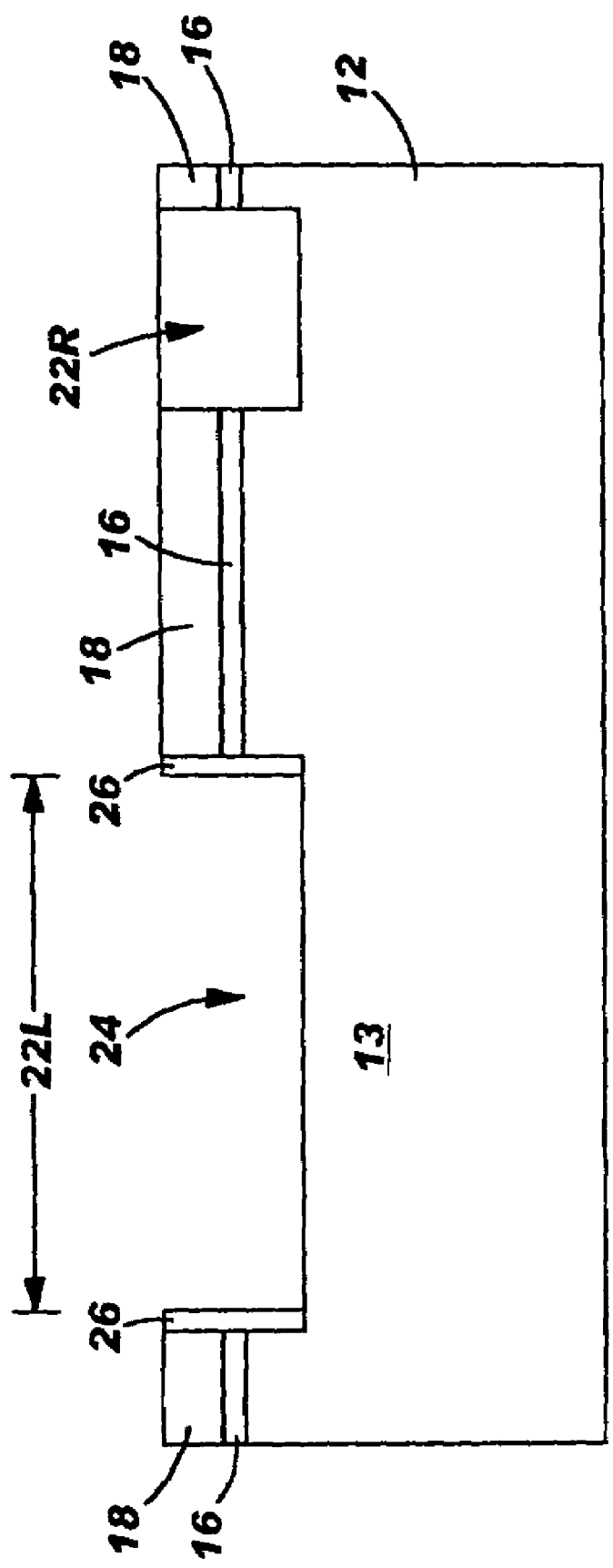

After removing the block mask from the structure, nitride or oxynitride spacers 26 are formed on the exposed sidewalls provided by opening 24. The spacers 26 are formed by deposition and etching, such as reactive ion etching. The resultant structure formed after the above steps have been performed is shown, for example, in FIG. 1C. Note that the structure shown in FIG. 1C represents the simplest embodiment of the present invention.

Figure 1D:
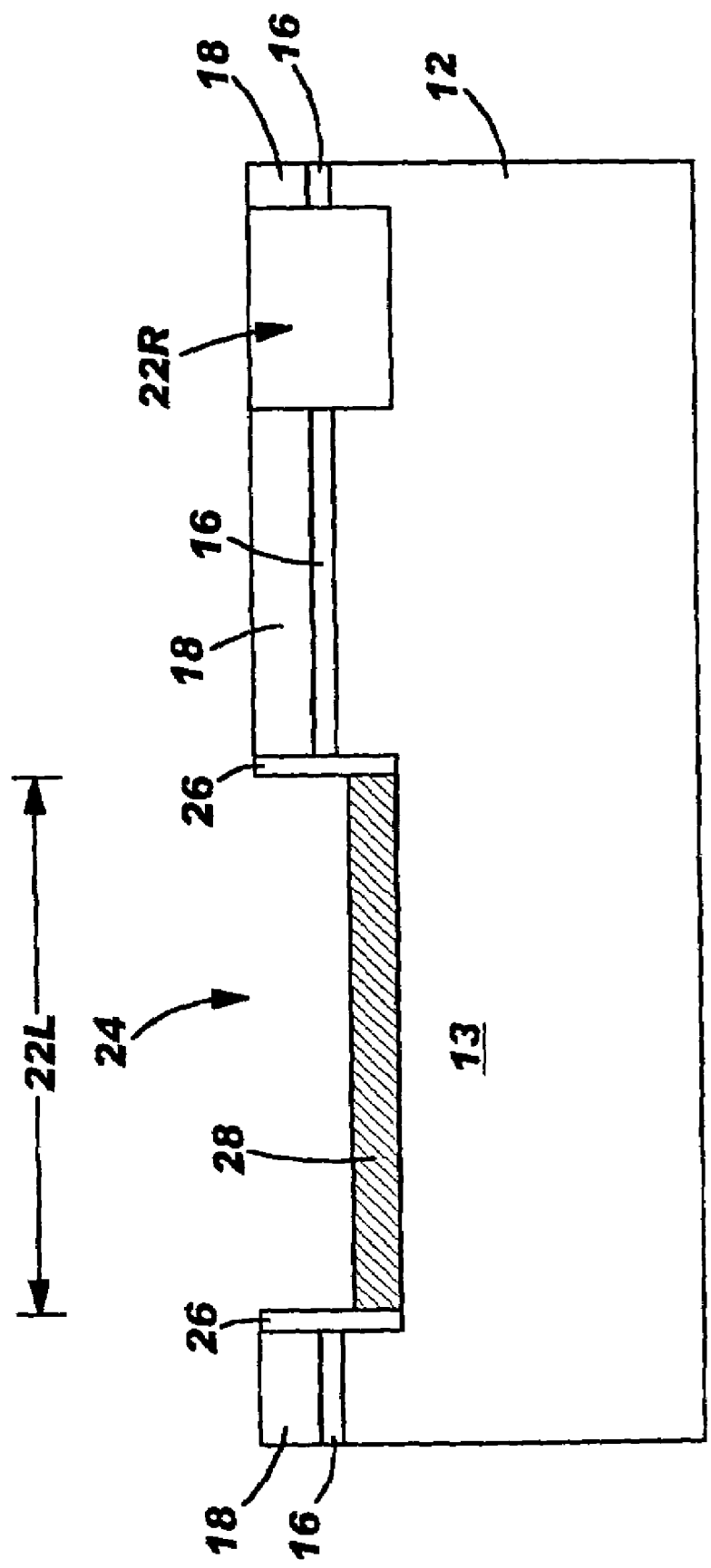

Next, and as shown in FIG. 1D, refractory metal silicide layer 28 is formed in the opening 24 atop the exposed portion of the substrate 12, i.e., on the subcollector 13. The refractory metal silicide layer 28 is formed by first depositing a refractory metal layer on the exposed surface of the substrate 12. If the substrate 12 does not contain silicon, a silicon layer can be formed on the exposed surface of the substrate 12 prior to deposition of the refractory metal layer. The refractory metal layer can be formed by a selective or non-selective deposition process. When a selective deposition process is employed, the refractory metal layer is formed entirely within the opening 24. When a non-selective deposition process is used, refractory metal layer is formed outside the opening 24 as well.

Illustrative examples of selective deposition processes include, but are not limited to chemical vapor deposition, while illustrative examples of non-selective deposition processes include, but are not limited to: chemical vapor deposition (CVD), plasma-enhanced chemical vapor deposition (PECVD) and sputtering.

The term "refractory metal" is used in the present invention to denote a metal-containing material (i.e., elemental metal or metal alloy) that is difficult to corrode or fuse, yet is capable of forming a silicide when reacted with silicon at high-temperatures. Examples of refractory metals that may be employed in the present invention include, but are not limited to: Ti, Co, W, Ta, Ni and alloys. The term "alloys" as used herein denotes a mixture of elemental refractory metals as well as an elemental refractory metal that includes an alloying additive such as, for example Si. Highly preferred refractory metals include Co, Ta and W, with W being most highly preferred since its silicide is capable of withstanding further high-temperature heating cycles used in forming a BiCMOS device.

The thickness of the refractory metal layer used in forming the refractory silicide layer 28 may vary depending on the deposition technique and type of refractory metal used. Typically, the refractory metal layer has a thickness from about 5 to about 150 nm, with a thickness from about 10 to about 100 nm being more typical.

The structure including the refractory metal layer is then annealed to form the refractory metal silicide layer 28 in the opening 24 atop the exposed portion of the substrate 12, i.e., on the subcollector 13. Annealing is performed until the silicide formed is in its lowest resistivity phase. For some refractory metals such as Ni, a single annealing step is needed to convert the refractory metal layer into a low-resistance silicide layer, while for other refractory metals such as Ti and W, a first annealing step is used to convert the refractory metal into a metal suicide of high resistance and then a second anneal is used to convert the high resistance metal silicide into its lowest resistance phase.

The first annealing step is typically performed at a temperature from about 400° C. to about 700° C. for a time period from about ½ minute to about 30 minutes. The first anneal is typical carried out in an inert gas such as He, Ar, Ne, Xe, Kr, $N_2$ or a mixture thereof. A single ramp-up rate, with or without soaking, may be employed in the present invention, or multiple ramp-up rates, with or without soaking, may be employed in the present invention.

During the first anneal, the refractory metal interacts and reacts with silicon to form a refractory metal silicide. During the interaction and subsequent reaction, most of the refractory metal and some of the silicon gets consumed.

Following the first anneal, any unreacted metal is removed from the structure utilizing a chemical etchant such as an inorganic acid. Note that when a non-selective deposition process is used, this etching step removes refractory metal formed outside opening 24 as well as any unreacted metal within opening 24.

If needed, a second annealing step may now be performed to convent the previously formed silicide into a lower resistance silicide. The second annealing step is typically performed at higher annealing temperatures than the first annealing step. For example, the second annealing step is typically performed at a temperature from about 700° C. to about 1100° C. for a time period from about 10 seconds to about 5 minutes. The second annealing step is also typically carried out in an inert ambient such as those mentioned above in connection with the first annealing step. A single ramp-up rate, with or without soaking or multiple ramp-up rates, with or without soaking, may also be employed.

The above steps, i.e., first annealing, removing unreacted metal and optional second annealing, are known in the art as a silicidation step.

As indicated above, the resultant structure after refractory metal silicide 28 is formed is shown in FIG. 1D. Note that the refractory metal silicide 28 is contained within the opening 24, i.e., it does not extend above the opening 24.

After silicide formation, a second trench dielectric material 30 is formed providing the structure shown, for example, in FIG. 1E. The second trench dielectric 30 is typically an oxide such as TEOS or a high-density oxide. The second trench dielectric 30 is formed by a conventional deposition process such as CVD or plasma-enhanced CVD. The second trench dielectric 30 typically has a thickness, after deposition, from about 200 to about 600 nm.

Next, the structure including the second trench dielectric 30 is subjected to a planarization process such as chemical mechanical polishing or grinding providing the substantially planarized structure shown in FIG. 1F. Specifically, and as shown, second dielectric layer 30 is planarized to the upper surface of pad stack 14, i.e., the pad nitride 18 providing a new shallow trench isolation region 22L' that includes second trench dielectric 30.

Following the planarization process, the HBT and other devices can be formed using conventional BiCMOS processing well known to those skilled in the art. For example, in the HBT device area, a SiGe base region and an emitter region including a polySi emitter can be formed by conventional base-after emitter or base-before emitter processing steps.

The HBT structure of the present including the structure shown in FIG. 1F lowers Rc because of the presence of the refractory metal suicide 28 underneath the shallow trench isolation region 22L' on the subcollector 13 of the substrate 12. The refractory metal silicide 28 extends under the collector contact (not shown) as well as the base contact (not shown).

FIGS. 1A-1F illustrate one embodiment of the present invention. FIGS. 2A-2E illustrate a second embodiment of the present invention in which a refractory metal silicide is formed in an opening that includes an optional, but preferred undercut region. The second embodiment of the present invention begins with first providing the structure shown in FIG. 1B of the present invention.

Next, a nitride-containing layer 32 such as silicon nitride or silicon oxynitride is formed atop the entire structure including the hard mask 20 and the shallow trench isolation region, 22R and 22L. The nitride-containing layer 32 is formed by a conventional deposition process such as CVD, PECVD, chemical solution deposition and the like. The nitride-containing layer 32 has a thickness that is typically from about 5 to about 200 nm, with a thickness from about 10 to about 100 nm being more typical.

A patterned photoresist 34 is then formed atop the structure including nitride-containing layer 32 providing the structure shown, for example, in FIG. 2A. The patterned photoresist 34 includes an opening 35 that is located above shallow trench isolation region 22L. The patterned photoresist 34 containing opening 35 is formed by lithography.

After providing the structure shown in FIG. 2A, opening 35 is extended into the shallow trench isolation region 22L by etching through nitride-containing layer 35, and part of the shallow trench isolation region 22L. Note that the patterned photoresist 34 has sidewalls that extend beyond the sidewalls of the shallow trench isolation region 22L such that the patterned photoresist 34 protects a portion of the shallow trench isolation region 22L.

The etching step used for extending the opening 35 includes a first etching step that selectively removes nitride stopping on oxide, and a second etching step which is timed and selectively removes oxide. In some embodiments, the first and second etching steps used for extending the opening 35 can be combined into a single etching step in which the exposed portion of the nitride layer 32, not protected by the patterned photoresist 34, is first removed and the a portion of the underlying first dielectric material of the shallow trench isolation region 22L is removed. Patterned photoresist 34 is removed after etching using a conventional stripping process.

After this etch which extends the opening 35, nitride or oxynitride spacers 26 are formed on the exposed sidewalls of the extended opening 35. The resultant structure including the extended opening 35 and the spacers 26 is shown in FIG. 2B. Note that the spacers 26 are formed as described above in the first embodiment of the present invention.

The remaining first trench dielectric of shallow trench isolation region 22L is then removed utilizing a wet etch process that selectively removes the first trench dielectric material, i.e., oxide, stopping on the surface of substrate 12. A lateral etch may now be optionally performed which provides undercut region 36 in the extended opening 35. The lateral undercut 36 is preferred since it ensures that the silicide will be in closer proximity to the emitter region. The lateral etch may be performed by a wet chemical etch such as HF-containing agent.

Figure 2C:
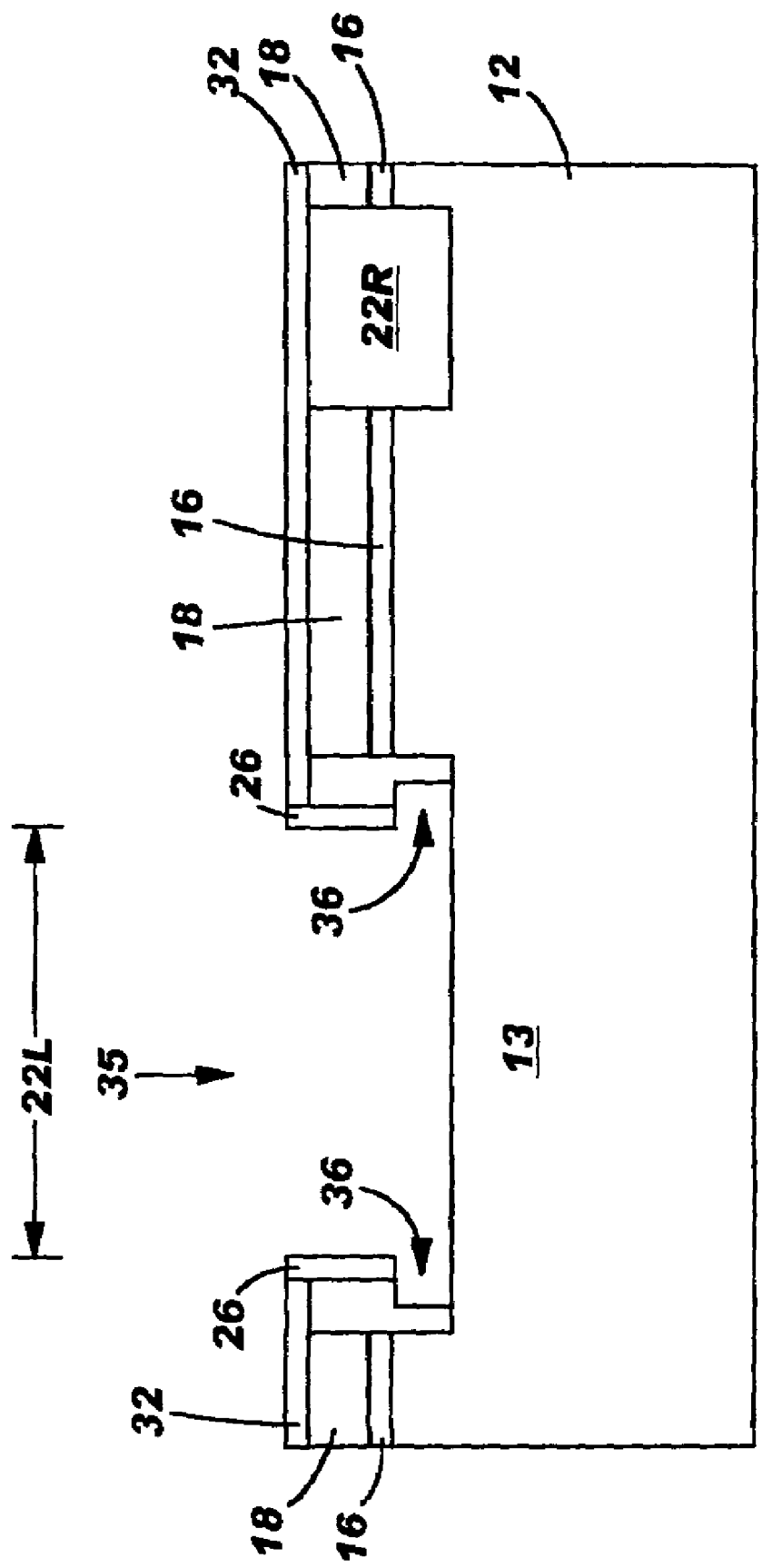
Figure 2D:
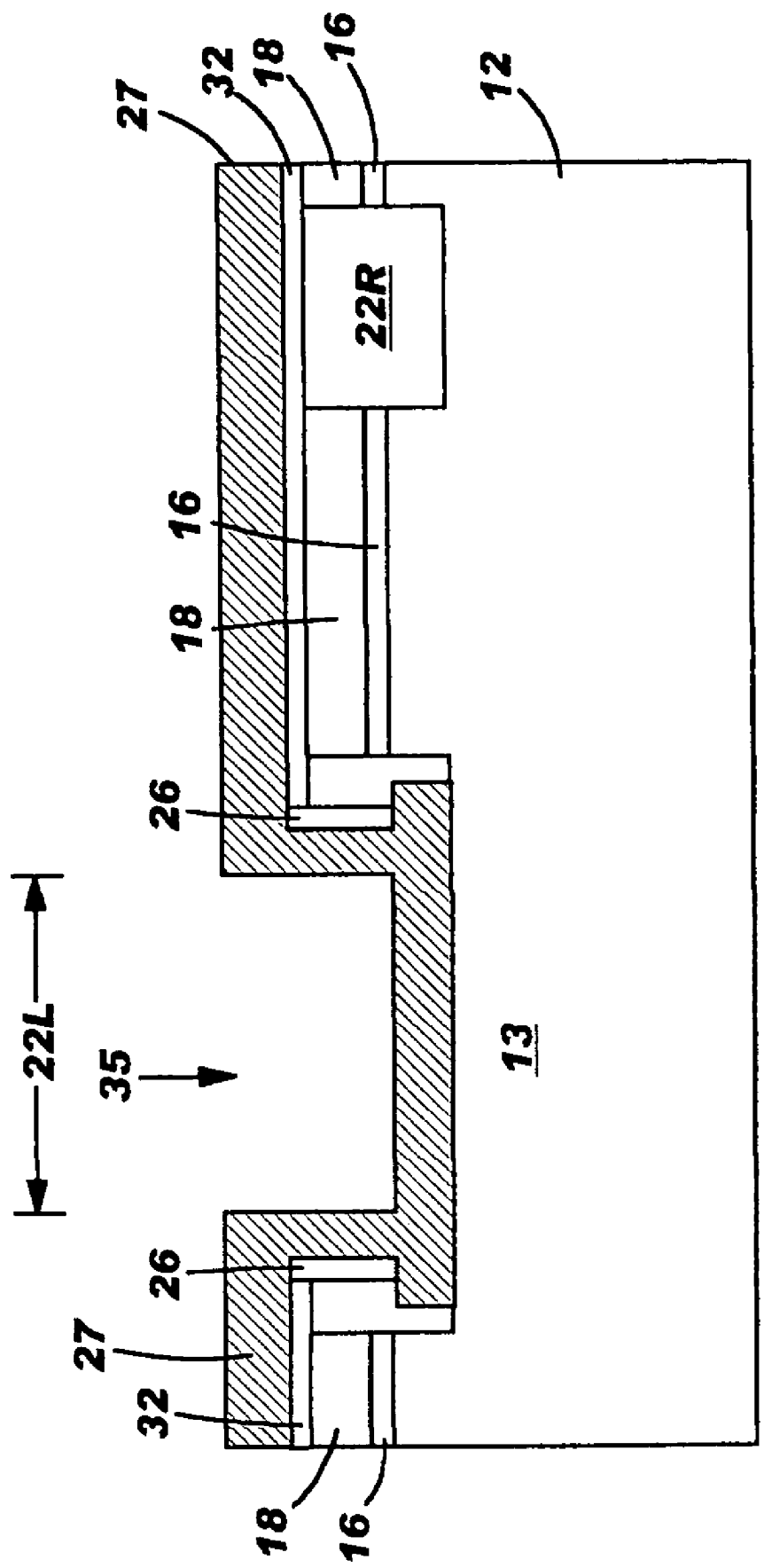

A refractory metal layer is then formed as described above. FIG. 2D shows an embodiment in which the refractory metal layer (designated by reference numeral 27) is formed by a non-selective deposition process. Although the drawing depicts the formation of the refractory metal layer 27 by a non-selective deposition method, the second embodiment also contemplates the selective deposition method described above as well.

Figure 2E:
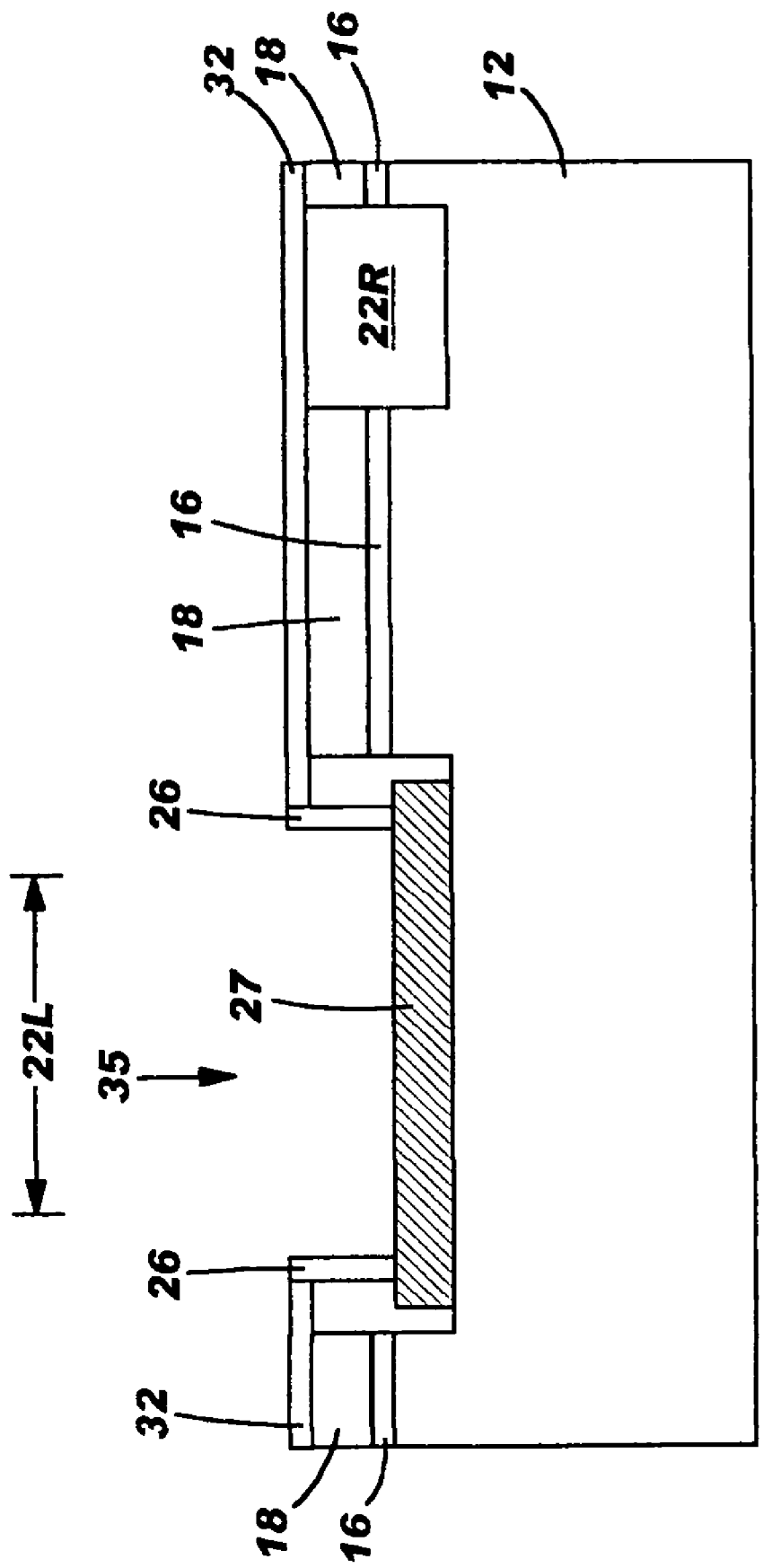

In the case illustrated, the refractory metal layer 27 that is outside of opening 35 is then removed providing the structure shown in FIG. 2E. The processing steps described above, i.e., silicide formation, and second trench dielectric material 30 formation and planarization, are then performed to provide a substantially planarized structure similar to the one shown in FIG. 1F except for the presence of the undercut region that is filled with silicide. CMOS processing and bipolar transistor formation can then be performed on the substantially planarized structure including the undercut region that is filled with a refractory metal silicide.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A heterobipolar transistor (HBT) comprising:
 a substrate including at least a semiconductor portion and a subcollector, wherein said semiconductor portion comprises a semiconductor material, said subcollector comprises said semiconductor material and a dopant, and said subcollector is located directly on and above said semiconductor portion;
 a buried refractory metal silicide layer abutting and located directly on and above said subcollector; and
 a shallow trench isolation region vertically abutting a surface of said buried refractory metal silicide layer.

2. The HBT of claim 1 wherein said substrate comprises a semiconductor substrate selected from the group consisting of Si, SiGe, SiC, SiGeC, GaAs, InAs, InP, silicon-on-insulators, silicon germanium-on-insulators, and other III/V or II/VI compound semiconductors.

3. The HBT of claim 2 wherein said semiconductor substrate is Si-containing.

4. The HBT of claim 1 wherein said subcollector is doped with C.

5. The HBT of claim 1, further comprising:
 a trench located in said substrate; and
 a nitride or oxynitride spacer located on a sidewall of said trench and in said substrate, wherein said shallow trench isolation region and said buried refractory metal silicide layer are vertically stacked within said trench and laterally surrounded by said nitride or oxynitride spacer.

6. The HBT of claim 1 wherein said refractory metal silicide layer comprises a silicide of Ti, Co, W, Ta, Ni or alloys thereof 7. The HBT of claim 6 wherein said refractory metal silicide layer comprises a silicide of Co, Ta or W.

8. The HBT of claim 7 wherein said refractory metal silicide layer comprises a silicide of W.

9. The HBT of claim 1 wherein said shallow trench isolation region comprises a trench dielectric material.

10. A heterobipolar transistor (HBT) comprising:
 a substrate including at least a semiconductor portion and a subcollector, wherein said semiconductor portion comprises a semiconductor material, said subcollector comprises said semiconductor material and a dopant, and said subcollector is located directly on and above said semiconductor portion;
 a buried refractory metal silicide layer abutting and located directly on and above said subcollector; and
 a shallow trench isolation region abutting a surface of said buried refractory metal silicide layer and located above said semiconductor portion.

11. The HBT of claim 10, further comprising a nitride or oxide spacer laterally abutting and located above said buried refractory metal silicide layer.

12. The HBT of claim 11, wherein said nitride or oxide spacer vertically abuts said subcollector.

13. The HBT of claim 11, further comprising a ring-shaped oxide portion laterally abutting an outer sidewall of said nitride or oxide spacer and located within said substrate.

14. The HBT of claim 13, wherein an inner sidewall of said ring-shaped oxide portion laterally abuts outer sidewalls of said buried refractory metal silicide layer.

15. The HBT of claim 14, wherein another inner sidewall of said ring-shaped oxide portion laterally abuts said outer sidewall of said nitride or oxide spacer, and wherein a horizontal step on a surface of said ring-shaped oxide portion vertically between said inner sidewall and said another sidewall vertically abuts said buried refractory metal silicide layer.

16. The HBT of claim 10, further comprising another shallow trench isolation region not abutting said shallow trench isolation region and located above said semiconductor portion and within said substrate.

17. The HBT of claim 10, wherein said shallow trench isolation region vertically abuts a surface of said buried refractory metal silicide layer.

18. A heterobipolar transistor (HBT) comprising:

a substrate including at least a semiconductor portion and a subcollector, wherein said semiconductor portion comprises a semiconductor material, said subcollector comprises said semiconductor material and a dopant, and said subcollector is located directly on and above said semiconductor portion;

a buried refractory metal silicide layer abutting and located directly on and above said subcollector;

a shallow trench isolation region abutting a surface of said buried refractory metal silicide layer; and a nitride or oxide spacer laterally abutting and located above said buried refractory metal silicide layer.

19. The HBT of claim 18, wherein said shallow trench isolation region vertically abuts a surface of said buried refractory metal silicide layer.

20. The HBT of claim 19, further comprising another shallow trench isolation region not abutting said shallow trench isolation region and located above said semiconductor portion and within said substrate.

* * * * *